(12) United States Patent
Gregory et al.

(10) Patent No.: US 10,948,294 B2
(45) Date of Patent: Mar. 16, 2021

(54) MEMS GYROSCOPES WITH IN-LINE SPRINGS AND RELATED SYSTEMS AND METHODS

(71) Applicant: Analog Devices, Inc., Norwood, MA (US)

(72) Inventors: Jeffrey A. Gregory, Malden, MA (US); Charles Blackmer, Londonderry, NH (US)

(73) Assignee: Analog Devices, Inc., Wilmington, MA (US)

( * ) Notice: Subject to any disclaimer, the term of this patent is extended or adjusted under 35 U.S.C. 154(b) by 260 days.

(21) Appl. No.: 15/946,119

(22) Filed: Apr. 5, 2018

(65) Prior Publication Data

US 2019/0310087 A1  Oct. 10, 2019

(51) Int. Cl.
*G01C 19/5712* (2012.01)
*G01C 19/5747* (2012.01)

(52) U.S. Cl.
CPC ..... *G01C 19/5712* (2013.01); *G01C 19/5747* (2013.01); *B81B 2201/0242* (2013.01)

(58) Field of Classification Search
CPC ............ G01C 19/5712; G01C 19/5747; G01C 19/5705; G01C 19/5755; B81B 2201/0242
USPC ............................ 73/504.02, 504.04, 504.12
See application file for complete search history.

(56) References Cited

U.S. PATENT DOCUMENTS

| | | |
|---|---|---|
| 5,241,861 A | 9/1993 | Hulsing, II |
| 5,392,650 A | 2/1995 | O'Brien et al. |
| 5,600,064 A | 2/1997 | Ward |
| 5,635,638 A | 6/1997 | Geen |
| 5,869,760 A | 2/1999 | Geen |
| 6,230,563 B1 | 5/2001 | Clark et al. |

(Continued)

FOREIGN PATENT DOCUMENTS

| | | |
|---|---|---|
| JP | 2011145129 A | 7/2011 |
| JP | 2014-510271 | 4/2014 |
| WO | WO 2012/120190 | 9/2012 |

OTHER PUBLICATIONS

Kranz et al., Micromechanical vibratory rate gyroscopes fabricated in conventional CMOS. Proc. Symposium Gyro Technology. Deutsche Gesellschaft Fuer Ortung und Navigation, 1997. Stuttgart ,Germany. Sep. 16-17; pp. 3.0-3.8.

(Continued)

*Primary Examiner* — Robert R Raevis
(74) *Attorney, Agent, or Firm* — Wolf, Greenfield & Sacks, P.C.

(57) ABSTRACT

Microelectromechanical systems (MEMS) devices (such as gyroscopes) configured to reject quadrature motion are described. Quadrature motion arises for example when the drive motion of a gyroscope couples to the sense motion of a gyroscope even in the absence of an angular motion. In some circumstances, quadrature motion may result from the fact that the springs used in a gyroscope have slanted sidewall, which can impart torque in the mechanics of the gyroscope. MEMS gyroscope of the type described herein may be configured to reject quadrature motion by using only springs oriented substantially parallel to the drive direction. One such spring includes only beams parallel the drive directions, and optionally. These MEMS gyroscopes may be used to sense, among others, roll and pitch angular rates.

20 Claims, 13 Drawing Sheets

(56) References Cited

U.S. PATENT DOCUMENTS

| | | | |
|---|---|---|---|
| 6,257,059 B1 | 7/2001 | Weinberg et al. | |
| 6,370,937 B2 | 4/2002 | Hsu | |
| 6,505,511 B1 | 1/2003 | Geen et al. | |
| 6,571,630 B1 | 6/2003 | Weinberg et al. | |
| 6,705,164 B2 | 3/2004 | Willig et al. | |
| 6,752,017 B2 | 6/2004 | Willig et al. | |
| 6,845,668 B2 | 1/2005 | Kim et al. | |
| 6,860,151 B2 | 3/2005 | Platt et al. | |
| 6,877,374 B2 | 4/2005 | Geen | |
| 6,883,361 B2 | 4/2005 | Wyse | |
| 7,032,451 B2 | 4/2006 | Geen | |
| 7,036,373 B2 | 5/2006 | Johnson et al. | |
| 7,204,144 B2 | 4/2007 | Geen | |
| 7,222,533 B2 | 5/2007 | Mao et al. | |
| 7,227,432 B2 | 6/2007 | Lutz et al. | |
| 7,284,429 B2 | 10/2007 | Chaumet et al. | |
| 7,287,428 B2 | 10/2007 | Green | |
| 7,313,958 B2 | 1/2008 | Willig et al. | |
| 7,347,094 B2 | 3/2008 | Geen et al. | |
| 7,421,897 B2 | 9/2008 | Geen et al. | |
| 7,675,217 B2 | 3/2010 | Delevoye et al. | |
| 8,096,181 B2 | 1/2012 | Fukomoto | |
| 8,266,961 B2 | 9/2012 | Kuang et al. | |
| 8,322,213 B2 | 12/2012 | Trusov et al. | |
| 8,342,023 B2 | 1/2013 | Geiger | |
| 8,354,900 B2 | 1/2013 | Cazzaniga et al. | |
| 8,453,504 B1 | 6/2013 | Mao | |
| 8,490,483 B2 | 7/2013 | Wrede et al. | |
| 8,539,832 B2 | 9/2013 | Potasek et al. | |
| 8,656,776 B2 | 2/2014 | Trusov et al. | |
| 8,783,105 B2 | 7/2014 | Kuhlmann et al. | |
| 8,794,067 B2 | 8/2014 | Schmid et al. | |
| 8,844,357 B2 | 9/2014 | Scheben et al. | |
| 8,991,247 B2 | 3/2015 | Trusov et al. | |
| 9,212,908 B2 | 12/2015 | Geen et al. | |
| 9,217,756 B2 | 12/2015 | Simon et al. | |
| 9,493,340 B2 | 11/2016 | Mahameed et al. | |
| 9,891,053 B2 * | 2/2018 | Seeger | G01C 19/5755 |
| 10,317,210 B2 | 6/2019 | Kub et al. | |
| 10,415,968 B2 | 9/2019 | Prikhodko et al. | |
| 10,514,259 B2 | 12/2019 | Jia et al. | |
| 2004/0226369 A1* | 11/2004 | Kang | B81B 3/0059 73/504.02 |
| 2006/0213265 A1 | 9/2006 | Weber et al. | |
| 2007/0062282 A1 | 3/2007 | Akashi et al. | |
| 2008/0282833 A1 | 11/2008 | Chaumet | |
| 2009/0223277 A1 | 9/2009 | Rudolf et al. | |
| 2012/0060604 A1 | 3/2012 | Neul et al. | |
| 2012/0125099 A1 | 5/2012 | Scheben et al. | |
| 2012/0210788 A1 | 8/2012 | Günther et al. | |
| 2012/0222483 A1 | 9/2012 | Blomqvist et al. | |
| 2013/0192363 A1 | 8/2013 | Loreck | |
| 2013/0269413 A1 | 10/2013 | Tao et al. | |
| 2014/0144232 A1* | 5/2014 | Lin | B81B 3/0051 73/504.12 |
| 2014/0190258 A1 | 7/2014 | Donadel et al. | |
| 2014/0260608 A1 | 9/2014 | Lin et al. | |
| 2015/0285633 A1 | 10/2015 | Kamal Said Abdel Aziz et al. | |
| 2015/0330783 A1 | 11/2015 | Rocchi et al. | |
| 2016/0025493 A1 | 1/2016 | Stewart | |
| 2016/0264404 A1 | 9/2016 | Acar | |
| 2016/0316146 A1 | 10/2016 | Kajimura | |
| 2016/0349056 A1 | 12/2016 | Thompson et al. | |
| 2017/0234684 A1* | 8/2017 | Coronato | G01C 19/5747 73/504.12 |
| 2018/0058853 A1 | 3/2018 | Jia et al. | |
| 2018/0172445 A1 | 6/2018 | Prikhodko et al. | |
| 2018/0172446 A1 | 6/2018 | Prikhodko et al. | |
| 2018/0172447 A1 | 6/2018 | Prikhodko et al. | |

OTHER PUBLICATIONS

Kranz, Design, Simulation and Implementation of Two Novel Micromechanical Vibratory-Rate Gyroscopes. Department of Electrical and Computer Engineering. Carnegie Mellon University. May, 1988. 41 pages.

Kumar et al., Amplitude modulated Lorentz force MEMS magnetometer with picotesla sensitivity. Journal of Micromechanics and Microengineering. Sep. 20, 2016; 26(10): http://iopscience.iop.org/article/10.1088/0960-1317/26/10/105021/meta#fnref-jmmaa3949bib003.

Li et al., Three-Axis Lorentz-Force Magnetic Sensor for Electronic Compass Applications. Journal of Microelectromechanical Systems. Aug. 2012;21(4):1002 http://ieeexplore.ieee.org/stamp/stamp.jsp?arnumber=6198750.

Park et al., Dynamics and control of a MEMS angle measuring gyroscope. Sensors and Actuators A: Physical 144.1 (2008): 56-63.

Prikhodko et al., Foucault Pendulum on a Chip: Angle Measuring Silicon Mems Gyroscope. 2011 IEEE 24th International Conference on Micro Electro Mechanical Systems (MEMS 2011), Cancun, Mexico. Jan. 23-27, 2011;161-4.

Trusov et al., Flat Is Not Dead: Current and Future Performance of Si-MEMS Quad Mass Gyro (QMG) System. 2014 IEEE/ION Position, Location and Navigation Symposium. (PLANS 2014). May 5-8, 2014. 7 pages.

Trusov et al., Force Rebalance, Whole Angle, and Self-Calibration Mechanization of Silicon MEMS Quad Mass Gyro. IEEE 2014 International Symposium on Inertial Sensors and Systems (ISISS). Feb. 25-26, 2014;149-50.

Zaman et al., A mode-matched silicon-yaw tuning-fork gyroscope with subdegree-per-hour Allan deviation bias instability. Journal of Microelectromechanical Systems 17.6 (2008): 1526-36.

* cited by examiner

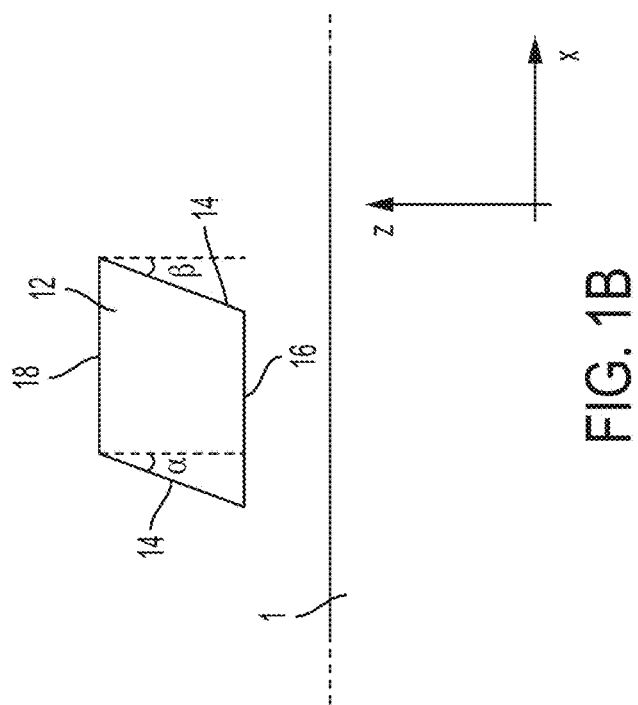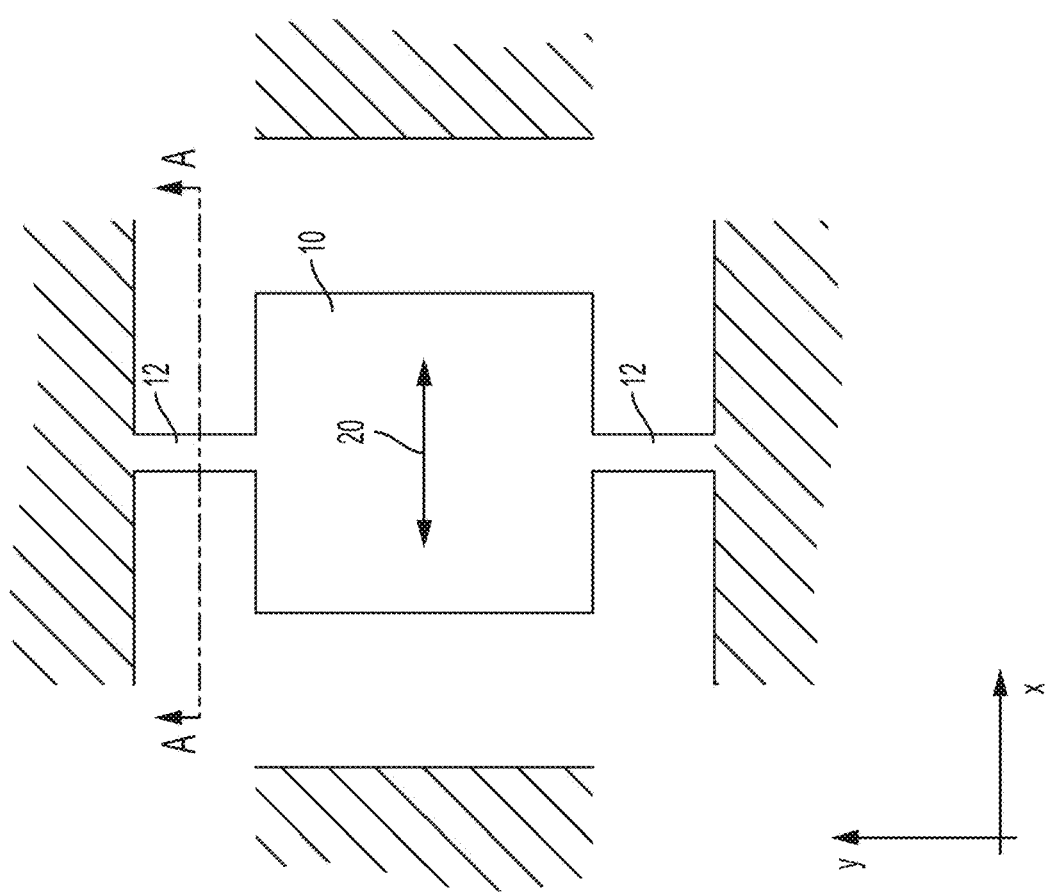

MEMS GYROSCOPES WITH IN-LINE SPRINGS AND RELATED SYSTEMS AND METHODS

FIELD OF THE DISCLOSURE

The present application relates to microelectromechanical system (MEMS) gyroscopes.

BACKGROUND

MEMS gyroscopes detect angular motion by sensing accelerations produced by Coriolis forces. Coriolis forces arise when a resonant mass of a MEMS gyroscope is subjected to angular motion.

SUMMARY OF THE DISCLOSURE

Some embodiments are directed to a microelectromechanical systems (MEMS) devices (such as gyroscopes) configured to reject quadrature motion. Quadrature motion arises for example when the drive motion of a gyroscope couples to the sense motion of a gyroscope even in the absence of an angular motion. In some circumstances, quadrature motion may result from the fact that the springs used in a gyroscope have slanted sidewall, which can impart torque in the mechanics of the gyroscope. MEMS gyroscope of the type described herein may be configured to reject quadrature motion by using only springs oriented substantially parallel to the drive direction. One such spring includes only beams parallel the drive directions, and optionally. These MEMS gyroscopes may be used to sense, among others, roll and pitch angular rates.

Some embodiments are directed to a MEMS device comprising a substrate, a proof mass lying substantially in a plane, an intermediate mass coupling the proof mass to the substrate, at least one drive electrode configured to cause motion of the proof mass substantially in a first direction, and at least one sense electrode disposed on the substrate and configured to sense motion of the proof mass in a second direction. The proof mass may be coupled to the intermediate mass only by one or more spring oriented substantially parallel the first direction.

Some embodiments are directed to a method for detecting angular motion using a MEMS gyroscope, the method comprising causing a proof mass to oscillate in a first direction, wherein causing the proof mass to oscillate in the first direction comprises causing an intermediate mass to pivot, the intermediate mass coupling the proof mass to a substrate, and the proof mass being coupled to the intermediate mass only by one or more spring oriented substantially parallel the first direction, and sensing motion of the proof mass in a second direction substantially perpendicular to the first direction.

Some embodiments are directed to a MEMS device comprising a substrate, a proof mass lying substantially in a plane, an intermediate mass coupling the proof mass to the substrate, at least one drive electrode configured to cause in-plane motion of the proof mass in a first direction, and at least one sense electrode disposed on the substrate and configured to sense out-of-plane motion of the proof mass in a second direction. The proof mass may be coupled to the intermediate mass only by one or more spring compliant in a direction substantially orthogonal to the first direction and to the second direction.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1A is a top view illustrating schematically a MEMS gyroscope.

FIG. 1B is a cross sectional view of the MEMS gyroscope of FIG. 1A taken along the AA line.

DETAILED DESCRIPTION

I. Overview

Figure 2A:
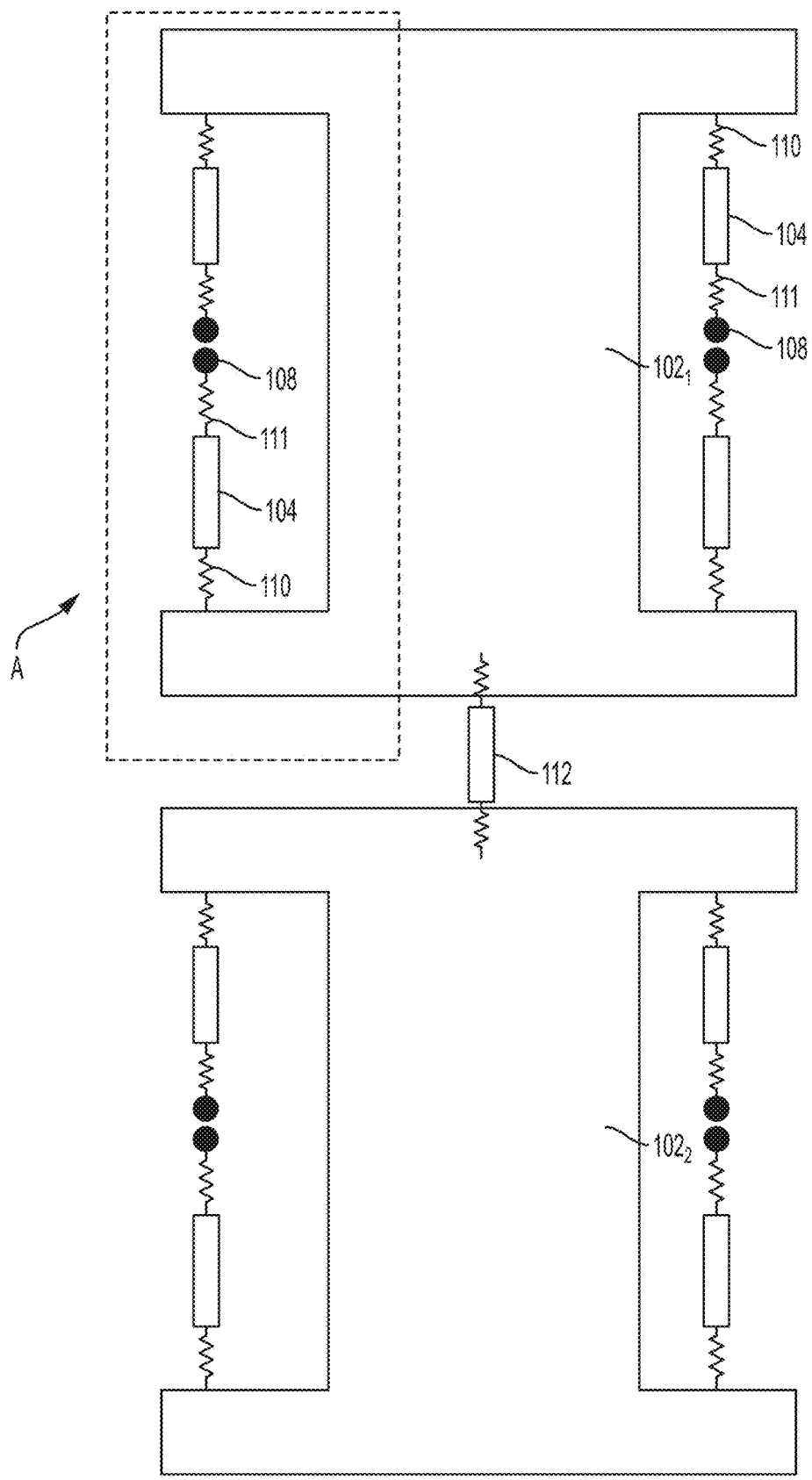
FIG. 2A is a top view illustrating schematically an example of a MEMS gyroscope having in-line springs, according to some non-limiting embodiments.

Applicant has appreciated that quadrature motion in microelectromechanical systems (MEMS) gyroscopes, whereby an erroneous output is generated by the MEMS gyroscope even in the absence of angular motion, may be reduced by using, for the MEMS gyroscope's proof masses, only springs compliant perpendicularly to the drive direction. MEMS gyroscopes are generally designed so that, when subject to angular motion, the drive mode is coupled to the sense mode. The expression "drive mode" is used herein to indicate the motion induced in the MEMS gyroscope when it is driven to oscillate. The expression "sense mode" is used herein to indicate the motion induced in the MEMS gyroscope when the gyroscope is driven to oscillate and is subject to angular motion. Quadrature motion occurs when, even in the absence of angular motion, the drive mode undesirably couples to the sense mode, thus giving rise to erroneous outputs.

Applicant has further appreciated that quadrature motion may arise, at least in some circumstances, when the springs of the MEMS gyroscopes have slanted sidewalls. Slanted sidewalls, which may result from inaccuracies in the etching processes used for fabricating MEMS devices, may give rise to a cross axis moment which may in turn cause out-of-plane motion of the proof mass when driven in-plane.

An example of a MEMS gyroscope suffering from quadrature motion due to slanted sidewalls is depicted in FIGS. 1A-1B. FIG. 1A is a top view illustrating a MEMS gyroscope. This MEMS gyroscope includes a proof mass 10 and springs 12, which connect proof mass 10 to the surrounding frame. Proof mass 10, which is suspended above an underlying substrate, is configured to detect angular rates through the detection of Coriolis forces. In particular, proof mass 10 is configured to detect angular rate about the y-axis. The Coriolis effect, and hence a Coriolis force, arises when: 1) proof mass 10 oscillates; and 2) the gyroscope is subjected to angular motion. In this example, a Coriolis force arises when the proof mass is driven to oscillate in the x-axis direction and the proof mass undergoes angular motion about the y-axis. Springs 12, which are generally oriented along the y-axis, are configured to enable motion of the proof mass in the x-axis direction. When proof mass 10 is driven to move back and forth in the x-axis direction (as illustrated by double arrow 20), springs 12 flex or bend, thus ensuring that the motion of the proof mass is indeed in the desired direction.

FIG. 1B is a cross sectional view of the gyroscope of FIG. 1A along the AA line. As shown, spring 12, which is essentially a beam oriented in the y-axis direction and suspended above substrate 1, has slanted sidewalls. Specifically, sidewalls 14 are angled by angles α and β relative to the perpendicular to the base 16. Angled sidewalls may be the result of inaccuracies in the etching processes used for forming the springs 12. It should be appreciated that angles α and β may be equal to or different from each other.

Slanted sidewalls as shown in FIG. 1B can give rise, due to the generation of a net torque, to quadrature motion of the proof mass. Quadrature motion is such that proof mass 10, when driven to oscillate in the x-axis direction, exhibits an out-of-plane motion (in the z-axis direction). The out-of-plane motion can be erroneously interpreted by the electronic circuit coupled to the MEMS gyroscope as an angular velocity. It should be appreciated that angles α and β have been exaggerated for illustrative purposes, but even angles as low as 0.1° or less may cause quadrature motion in some circumstances. It should be further appreciated that a net out of plane motion may arise and may be proportional to the average of angles α and β. Recognizing this problem, Applicant has developed MEMS gyroscopes that reject (e.g., limit or eliminate entirely) quadrature motion in the presence of slanted sidewalls. The MEMS gyroscopes according to aspects of the present application utilize in-line springs for rejecting quadrature motion. In-line springs of the types described herein are oriented substantially along the drive direction and/or are configured to be compliant in the direction substantially perpendicular to the drive direction. Gyroscopes according to some embodiments utilize only in-line springs (e.g., no springs oriented orthogonally relative to the drive direction and no springs compliant in directions other than that substantially perpendicular to the drive direction are used). Aspects of the present application employ only in-line springs despite such springs having potential drawbacks, including greater complexity and additional on-chip real estate usage compared to alternatives. For example, greater complexity and real estate usage may result from the fact that, in the embodiments comprising levers and in-line springs, the design of the gyroscope involves multiple mechanical components configured to move in unison.

II. Examples of MEMS Gyroscopes

FIG. 2A is a top view illustrating a MEMS gyroscope having in-line springs, according to some non-limiting embodiments. MEMS gyroscope 100 may include proof masses $102_1$ and $102_2$, anchors 108, levers 104, in-line springs 110 and 111, and paddle 112. In-line springs 111 may couple anchors 108 to levers 104; in-line springs 110 may couple levers 104 to the respective proof mass. The in-line springs, as will be described in detail further below, are oriented substantially along (e.g., within less than 5° of) the drive direction (the x-axis direction in this case) and are compliant along the direction substantially perpendicular to (e.g., within less than 5° relative to the normal to) the drive direction. It should be appreciated that the in-line springs of FIG. 2A are depicted with symbols intended to show the direction of compliance (the y-axis direction) rather than the physical orientation. As will be described further below, the in-line springs are physically implemented with beams oriented substantially along the drive the direction.

It should be appreciated that not all embodiments are limited to two proof masses as shown in FIG. 2A, as gyroscopes of the types described herein may include any other suitable number of proof masses.

As illustrated in FIG. 2A, only in-line springs may be connected to the prof masses $102_1$ and $102_2$. That is, no other types of springs (e.g., no springs compliant in directions other than that substantially perpendicular to the drive motion) are used for enabling the driving of the proof masses. As described above, using only springs compliant in the y-axis may limit quadrature motion caused for example by slanted sidewalls in the springs. Proof masses $102_1$ and $102_2$ may have, among other shapes, a generally rectangular (e.g., a square) shape. Paddle 112 may connect proof mass $102_1$ to proof mass $102_2$ and may be compliant in the y-axis direction.

Proof masses $102_1$ and $102_2$ may lie substantially in a plane. For example, proof masses $102_1$ and $102_2$ may each have a pair of opposing surfaces (spaced from each other in the z-axis direction) that are parallel to each other or angled relative to each by less than 5°.

It should be appreciated that, in some embodiments, gyroscope 100 may also include orthogonal springs (springs oriented along the direction perpendicular to the drive motion). However, such orthogonal springs may not be directly connected to the proof masses and/or may not contribute to the drive motion stiffness. In this way, even if orthogonal springs are used, quadrature motion is nonetheless rejected.

MEMS gyroscope 100 may be driven to oscillate in the x-axis direction, and to detect angular rate about the y-axis direction. In some embodiments, proof masses $102_1$ and $102_2$ are driven to oscillate in the x-axis direction with substantially opposite phases (e.g., with a phase difference between 170° and 190°, such as 180° referred to as anti-phase). Drive mechanisms (not shown in FIG. 2A) may be used to drive the proof mass in the x-axis direction. One type of drive mechanism includes drive capacitors, in which electrostatic forces are used to cause motion of the proof masses.

Figure 2B:
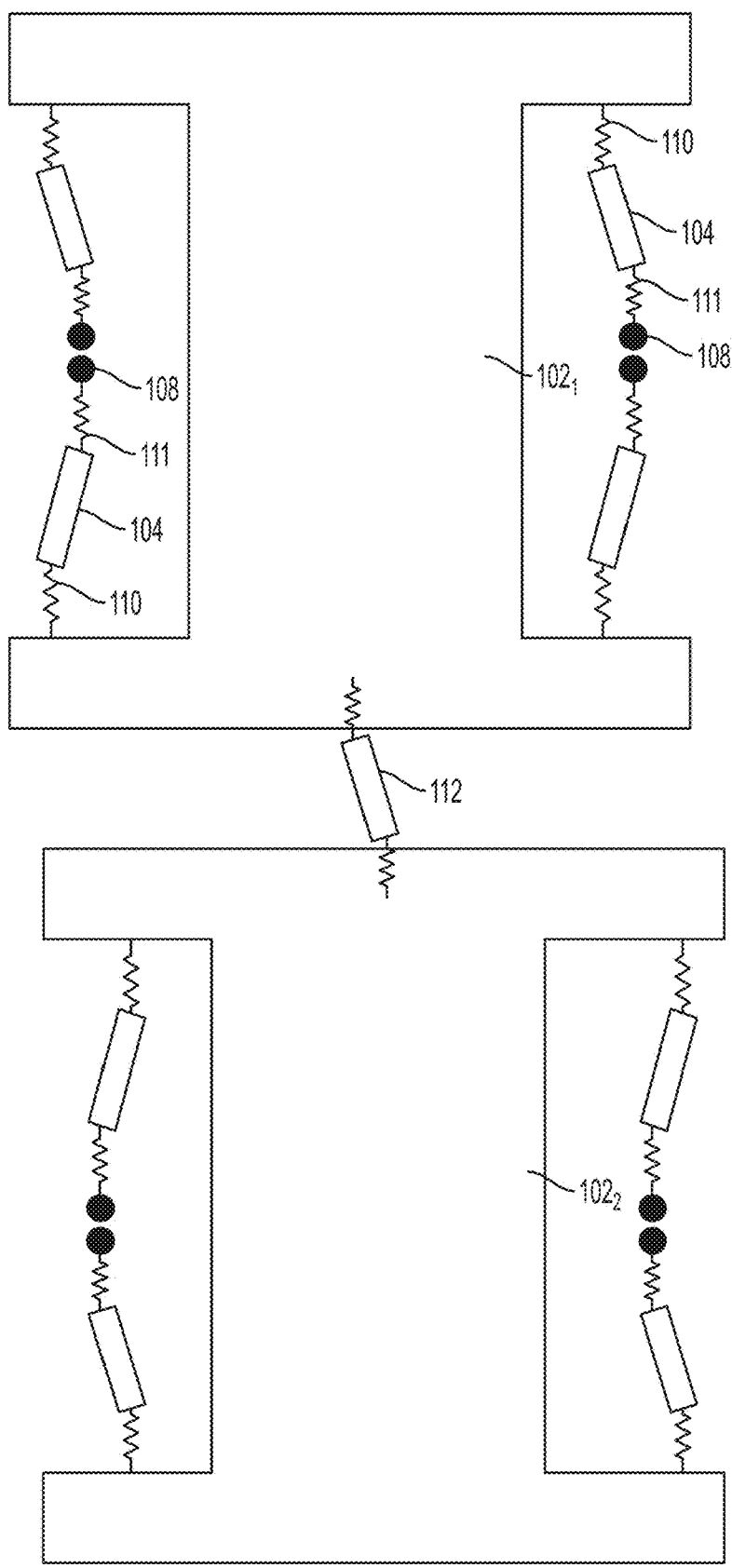
FIG. 2B is a top view illustrating schematically the MEMS gyroscope of FIG. 2A when driven in the x-axis direction, according to some non-limiting embodiments.

FIG. 2B is a top view of the gyroscope of FIG. 2A with proof masses $102_1$ and $102_2$ oscillating along the x-axis and anti-phase relative to each other. As shown, motion of the proof masses is enabled by the in-line springs 110 and 111 and the levers 104. Specifically, springs 110 and 111, by extending and compressing along the y-axis direction, allow the levers 104 to pivot. As a result, the proof masses can move relative to the position of the anchors 108. An example illustrating a physical implementation of the levers and the in-line springs is illustrated further below. Levers 104 are also referred to herein as "intermediate masses," because they may serve as intermediate structures between the proof masses and the substrate. In some embodiments, the proof masses are coupled to the intermediate masses only by springs oriented substantially in the drive direction. Intermediate masses other than levers 104 may be used to couple the proof masses to the substrate while facilitating motion of the proof masses in the drive direction. Such intermediate masses may be flexible and/or bendable. Paddle 112, connecting proof mass $102_1$ with proof mass $102_2$, may be arranged to maintain the anti-phase relationship between the proof masses.

When the gyroscope is subjected to angular motion about the y-axis, a Coriolis force may arise which may cause out-of-plane motion of the proof masses. The angular rate may be determined based on the magnitude of the out-of-plane acceleration and resulting motion, for example using a capacitive sensor, or strain using a piezoelectric sensor.

Figure 3A:
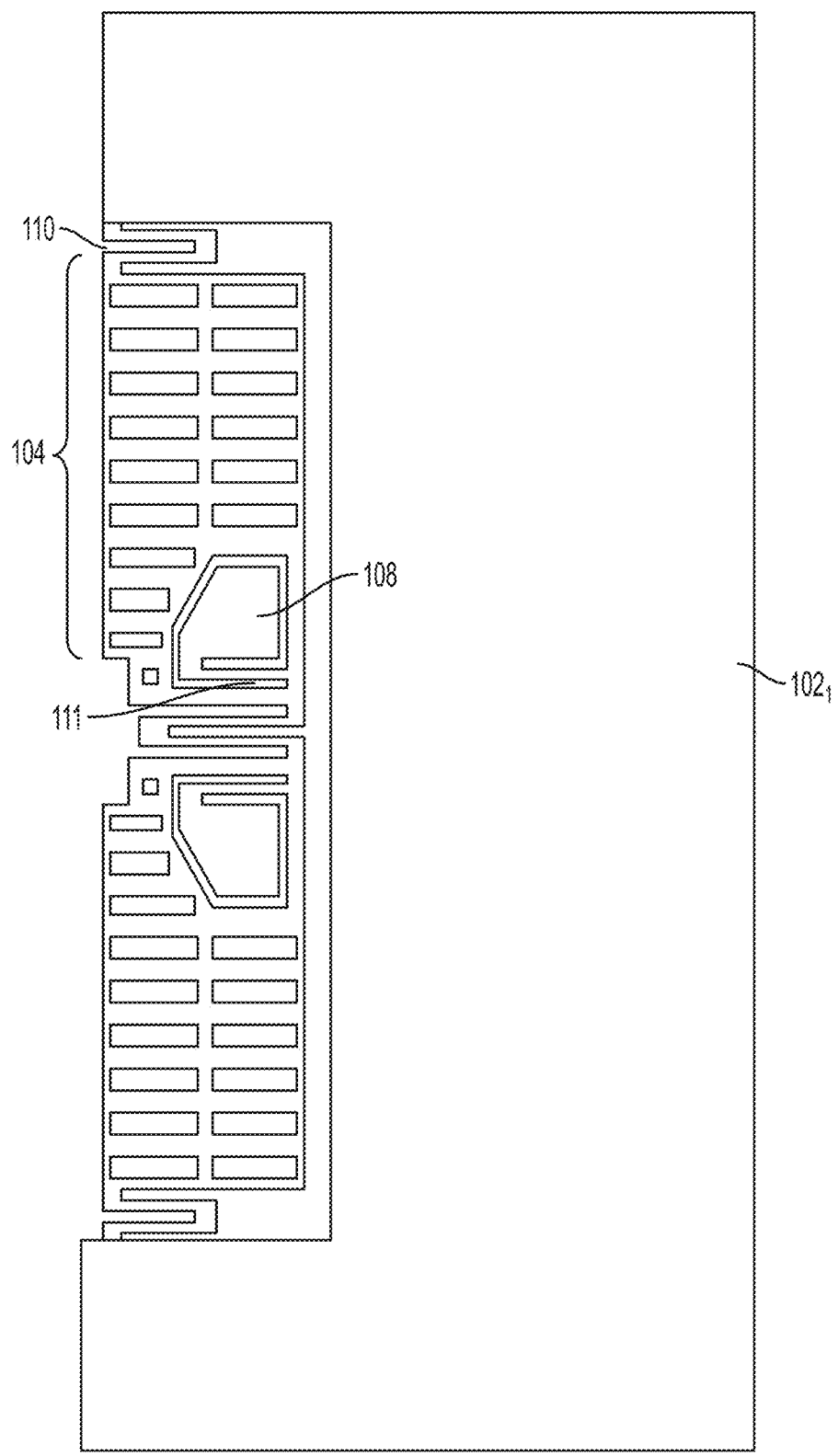
FIG. 3A is a top view illustrating portion "A" of the MEMS gyroscopes of FIG. 2A, according to some non-limiting embodiments.

FIG. 3A illustrates in additional detail the region labeled "A" of FIG. 2A, in accordance with some non-limiting embodiments. It should be appreciated that implementations of the in-line springs 110 and 111 and levers 104 other than those illustrated in FIG. 3A may be used. In the example of FIG. 3A, in-line springs 110 are substantially oriented along the drive direction (the x-axis direction). Specifically, in this case, in-line spring 110 includes beams substantially oriented along the drive direction. In some embodiments, in-line springs 110 may be compliant (e.g., may be able to compress and extend) in a direction substantially perpendicular to the drive direction (e.g., the y-axis). It should be appreciated that in-line spring 110 may also include beams connecting the beams oriented in the x-axis direction that are not oriented in the x-axis direction. However, these beams may be shorter than the beams oriented in the x-axis direction, thus maintaining the in-line spring's compliance along the y-axis.

Lever 104 may include a mass coupled between in-line spring 110 and anchor 108. In this case, levers 104 are shown as having multiple holes formed therethrough, the holes being used for releasing the underlying sacrificial layer during fabrication. Lever 104 may be coupled to anchor 108 via in-line spring 111. Similar to in-line spring 110, in-line spring 111 may be oriented substantially along the drive direction (e.g., the x-axis) and may be compliant in a direction substantially perpendicular to the drive direction (e.g., the y-axis). For example, in-line spring 111 may include beams oriented in the drive direction that are longer than the beams oriented in other directions.

Figure 3B:
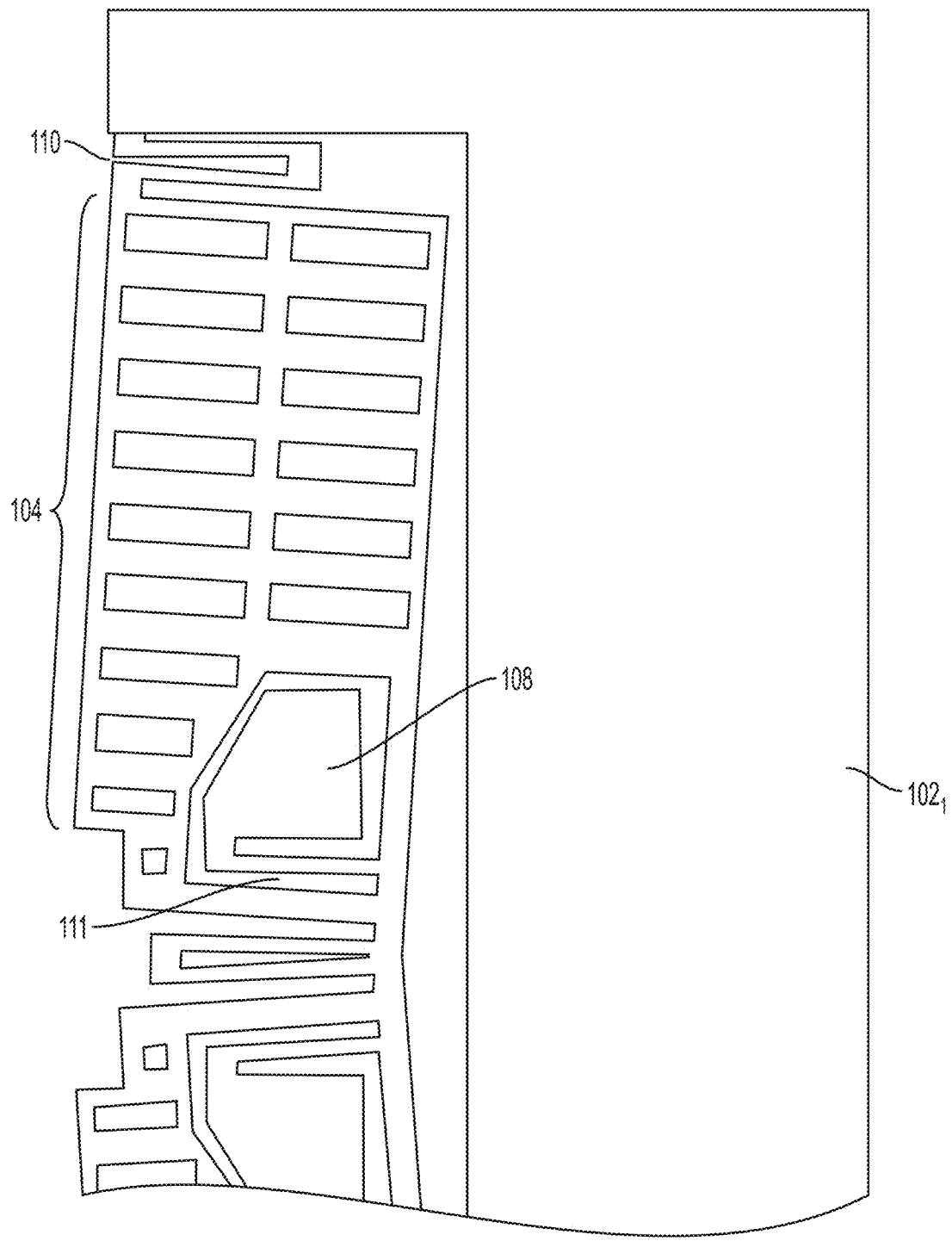
FIG. 3B is a top view illustrating the MEMS gyroscope portion of FIG. 3A when driven in the x-axis direction, according to some non-limiting embodiments.

Motion of proof mass $102_1$ in the drive direction may be enabled by motion of the levers 104. Motion of the levers 104 may in turn by enabled or facilitated by compliance of the in-line springs in the y-axis direction. FIG. 3B illustrates the gyroscope's portion of FIG. 3A when driven in the x-axis direction. In this case, the proof mass $102_1$ is displaced, relative to its position at rest, due to a movement to the right-hand side of the page. As shown, motion of the proof mass is enabled or facilitated by compliance of the springs in the direction perpendicular to the drive direction. The compliance of the in-line springs allows a rotation of the levers 104 in the xy-plane, allowing the proof mass to move freely along the x-axis.

Figure 4B:
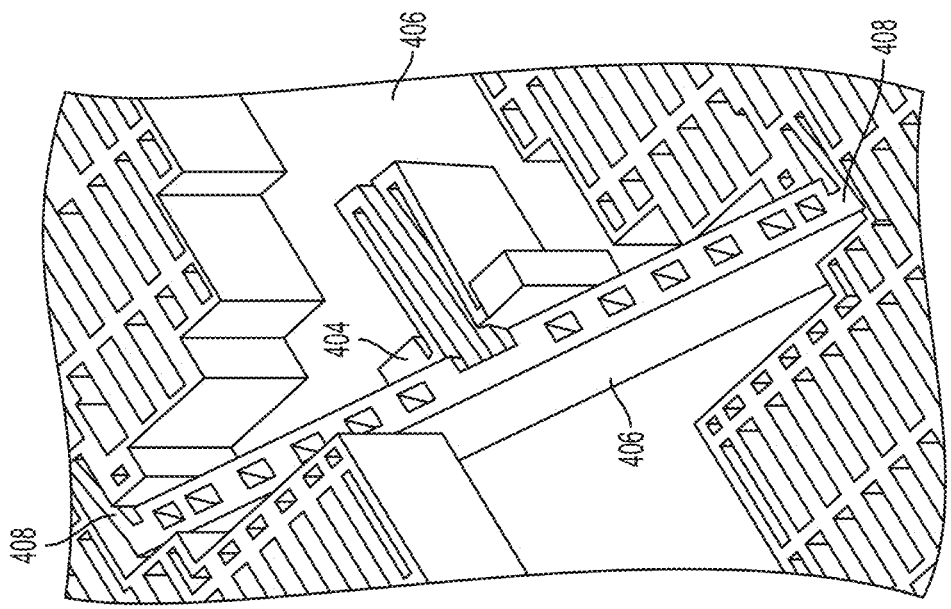
FIG. 4B is a perspective view of the paddle of FIG. 4A, according to some non-limiting embodiments.
Figure 4A:
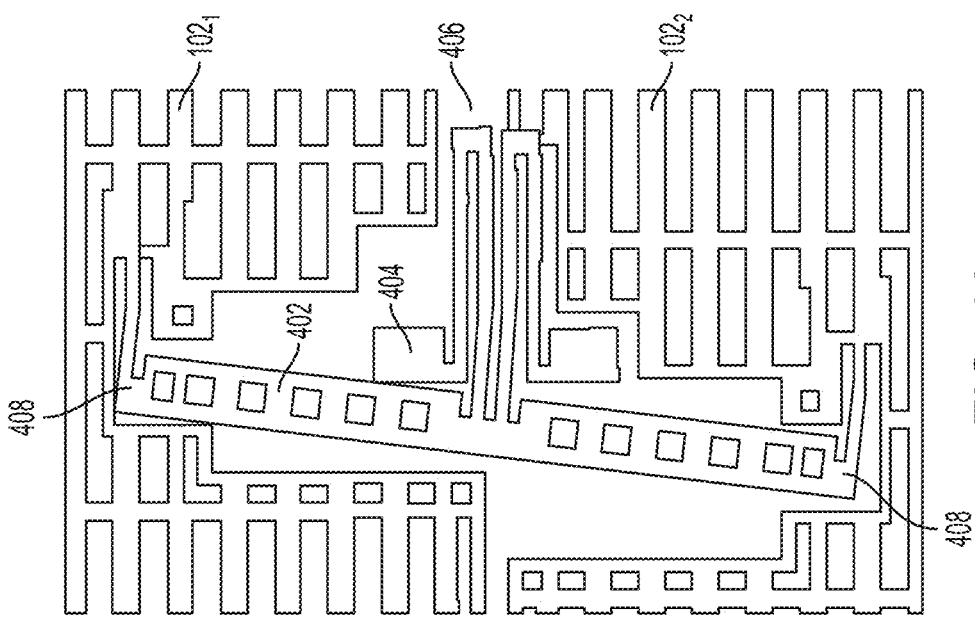
FIG. 4A is a top view illustrating schematically an example of a paddle that may be used in connection with the MEMS gyroscope of FIG. 2A, according to some non-limiting embodiments.

As described above, paddle 112 may be configured to maintain the anti-phase relationship in the motion of proof masses $102_1$ and $102_2$. A non-limiting example of a lever is illustrated in FIGS. 4A-4B. In this case, paddle 112 includes a beam 402, a spring 406, anchors 404 and springs 408. Spring 406 couples beam 402 to anchors 404. Springs 408 couple the ends of beam 402 to the respective proof mass ($102_1$ on one side and $102_2$ on the other side). In this example, proof masses $102_1$ and $102_2$ and beam 402 are shown with holes for releasing the underlying sacrificial layer, though not all embodiments are limited in this respect.

Beam 402, which in this case is oriented along the y-axis, is configured to rotate when the proof masses move with an anti-phase relationship. In this case, beam 402 is rotated due to the fact that proof mass $102_1$ has moved towards the right-hand side of the page and proof mass $102_2$ has moved towards the left-hand side of the page. Rotation of the beam 402 is enabled by springs 408, which may be oriented in the x-axis and may be compliant in the y-axis. Accordingly, when springs 408 flex in the y-axis, beam 402 rotates. Rotation of beam 402 may be further enabled by spring 406, which may be oriented in the x-axis (e.g., may have first and second beams, the first beams being oriented in the x-axis and the second beams in the y-axis, where the first beams are longer and/or narrower than second beams). Being oriented in the x-axis, spring 406 may be compliant in the y-axis.

The paddle may also enable out-of-plane motion of the proof masses, which may arise in response to a Coriolis acceleration. As shown in FIG. 4B, when a Coriolis acceleration arises, proof masses $102_1$ and $102_2$ may move out-of-plane in an anti-phase relationship. Out-of-plane rotation of beam 402 may be enabled by torsional compliance of springs 408 and spring 406.

Figure 5:
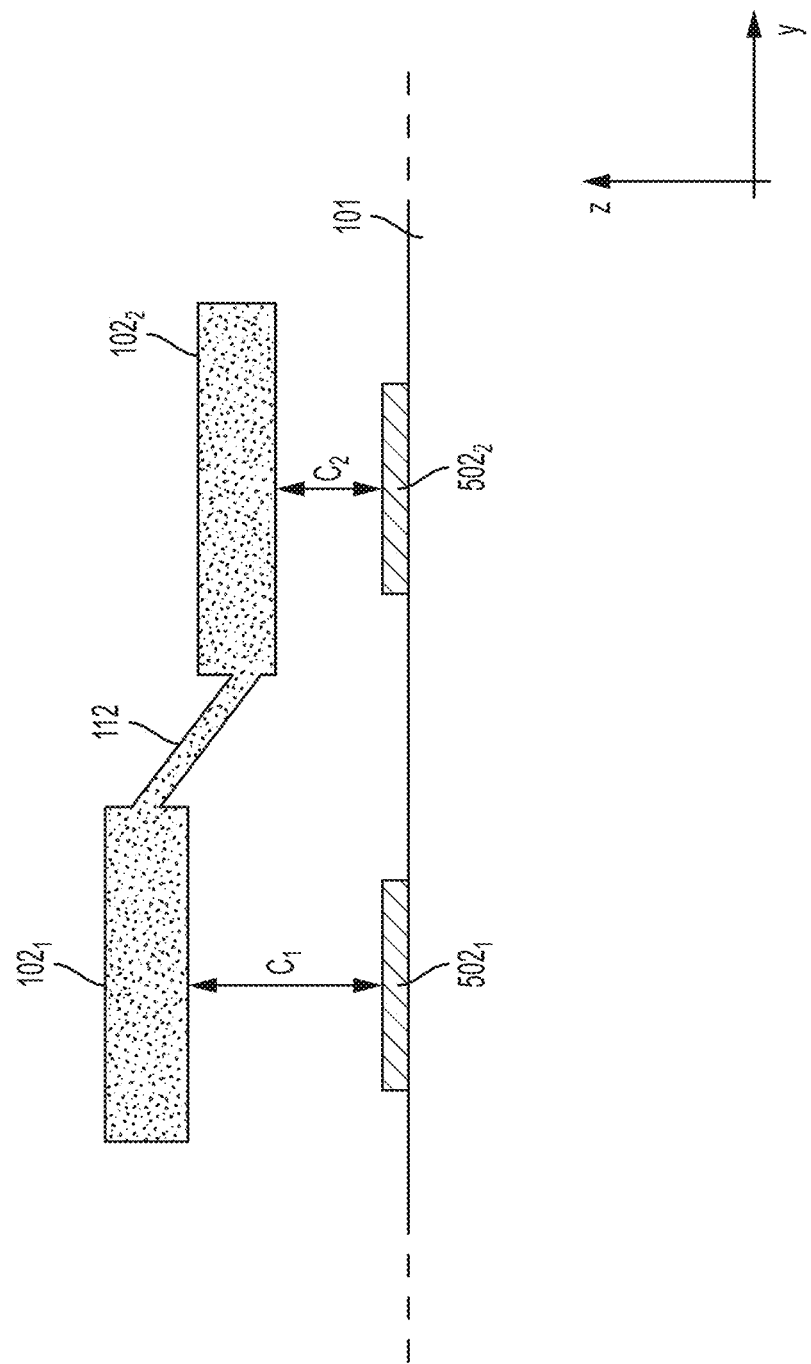
FIG. 5 is a side view of the MEMS gyroscope of FIG. 2A, according to some non-limiting embodiments.

When a gyroscope of the types described herein is subjected to angular motion, a Coriolis force may arise provided that the proof masses are oscillating. An example of an out-of-plane motion of the proof masses responsive to a Coriolis force is illustrated in FIG. 5, which is a side view of the gyroscope of FIG. 2A. In this example, proof masses $102_1$ and $102_2$, move in the z-axis direction with substantially opposite phases (e.g., with a phase difference between 170° and 190°, such as 180°) due to the fact that they are driven substantially anti-phase in the x-axis direction. The extent to which the proof masses move under the Coriolis force may be sensed, at least in some embodiments, using sense capacitors. The sense capacitors may be formed between a proof mass and a sense electrode disposed on the underlying substrate. For example, a sense capacitor $C_1$ may be formed between proof mass $102_1$ and sense electrode $502_1$ and a sense capacitor $C_2$ may be formed between proof mass $102_2$ and sense electrode $502_2$. Variations in the distance between a sense electrode and the respective proof mass may cause variations in capacitance of the sense capacitor. The magnitude of the Coriolis force, and hence the angular rate, may be determined based on the variation in capacitance. Sense circuitry, not illustrated in FIG. 5, may be coupled to the sense electrodes and may be used to sense variations of capacitance. The sense circuitry may be disposed on the same substrate on which the MEMS gyroscope is disposed. In other embodiments, the sense circuitry and the MEMS gyroscope may be disposed on separate substrates, which may be bonded to one another and/or packaged within a common housing.

Driving the proof masses substantially anti-phase relative to one another may give rise to differential sense signals, which may provide enhanced immunity to common mode disturbances, such as linear acceleration, external noise or stress-induced offset.

MEMS gyroscopes of the types described herein may be used to sense angular rates about one, two or three axes. Some MEMS gyroscopes, for example, may be used to detect roll, pitch and/or yaw angular rates. It should be appreciated that not all embodiments are configured to sense angular rates in three orthogonal directions, as some embodiments may be configured to sense angular rates in two directions (e.g., one in-plane direction and one out-of-plane direction or two in-plane directions) and yet other embodiments may be configured to sense angular rates in one directions (e.g., an in-plane direction or an out-of-plane direction).

Figure 6A:
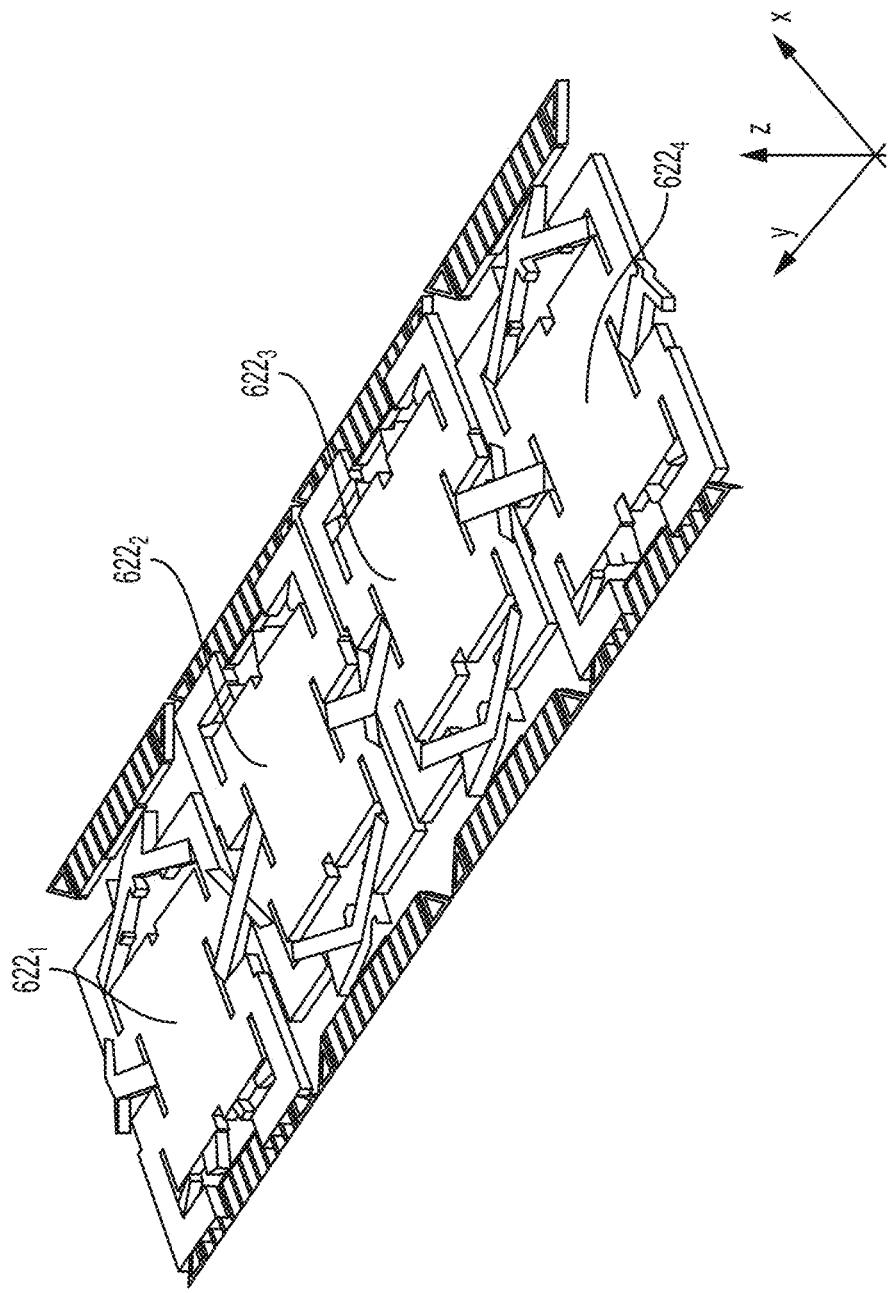
FIG. 6A is a perspective view illustrating schematically a MEMS gyroscope when driven in the x-axis direction, according to some non-limiting embodiments.

FIG. 6A illustrates proof masses $622_1$, $622_2$, $622_3$ and $622_4$, which may be configured to sense roll angular rates and may operate as described in connection with proof masses $102_1$ and $102_2$. For example, proof masses $622_1$ and $622_4$ may be driven substantially in-phase (e.g., with a phase difference between −10° and 10°, such as 0°) with one another, and may be driven substantially anti-phase relative to proof masses $622_2$ and $622_3$. Proof masses $622_2$ and $622_3$ may be connected to each other via a rigid connection to support in-phase motion of the proof masses with separate half paddles as on the outer edges of masses $622_1$ and $622_4$. It should be appreciated that not all embodiments include four proof masses, as different number of proof masses may be used.

FIG. 6A illustrates the drive mode of proof masses $622_1$, $622_2$, $622_3$ and $622_4$, whereby proof masses $622_1$ and $622_4$ are driven substantially in-phase with one another and substantially anti-phase relative to masses $622_2$ and $622_3$.

Figure 6B:
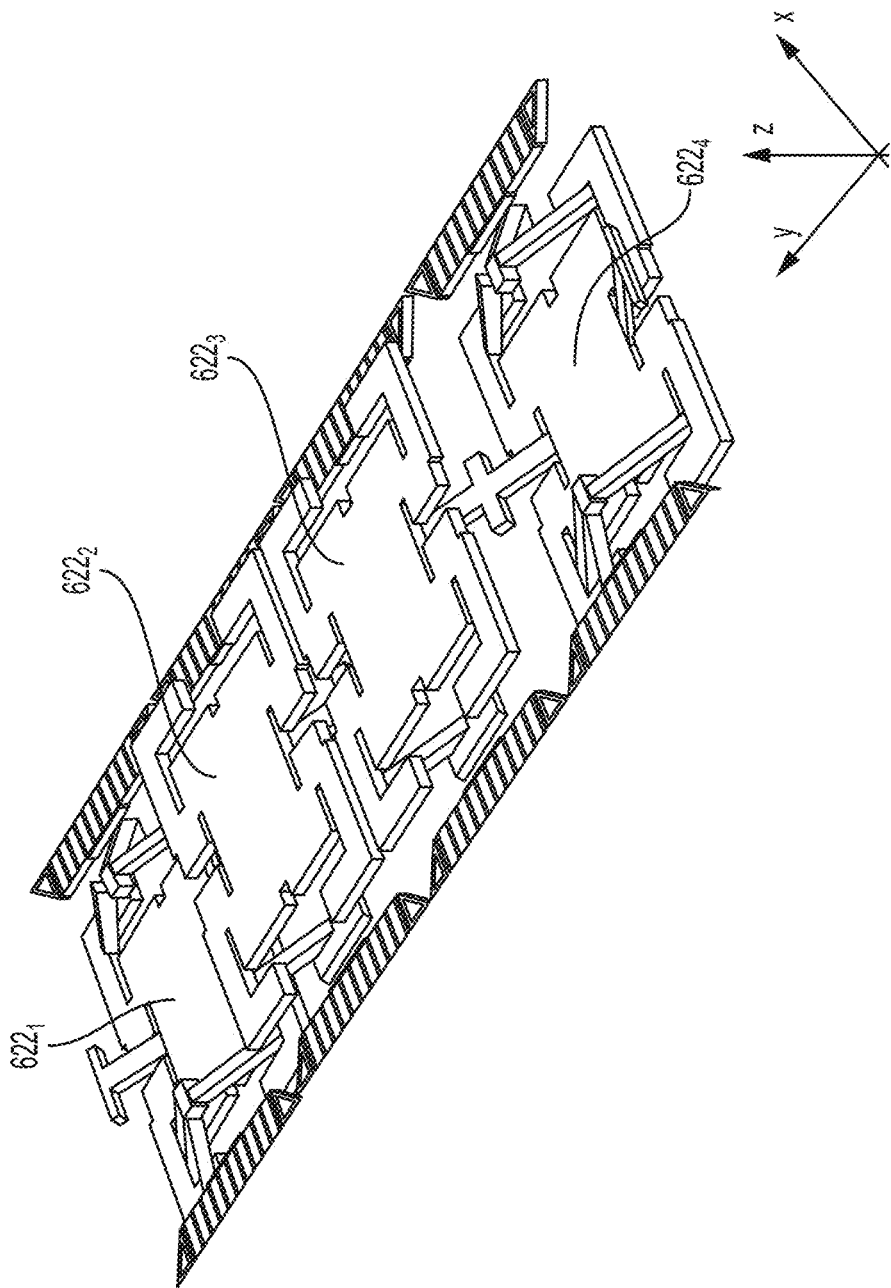
FIG. 6B is a perspective view illustrating schematically the MEMS gyroscope portion of FIG. 6A in the presence of a roll angular motion, according to some non-limiting embodiments.

When gyroscope 600 is driven and is also subjected to angular motion about the y-axis, proof masses $622_1$, $622_2$, $622_3$ and $622_4$ may move out-of-plane is response to a Coriolis force. This scenario is illustrated in FIG. 6B. As illustrated, proof masses $622_1$ and $622_4$ may move substantially in-phase with one another, and may move substantially anti-phase relative to proof masses $622_2$ and $622_3$. Roll angular rates may be determined by sensing differential signals arising from the out-of-plane motion of these proof masses. To reject quadrature motion, proof masses $622_1$, $622_2$, $622_3$ and $622_4$ may include in-line springs and levers of the types described herein.

Figure 6C:
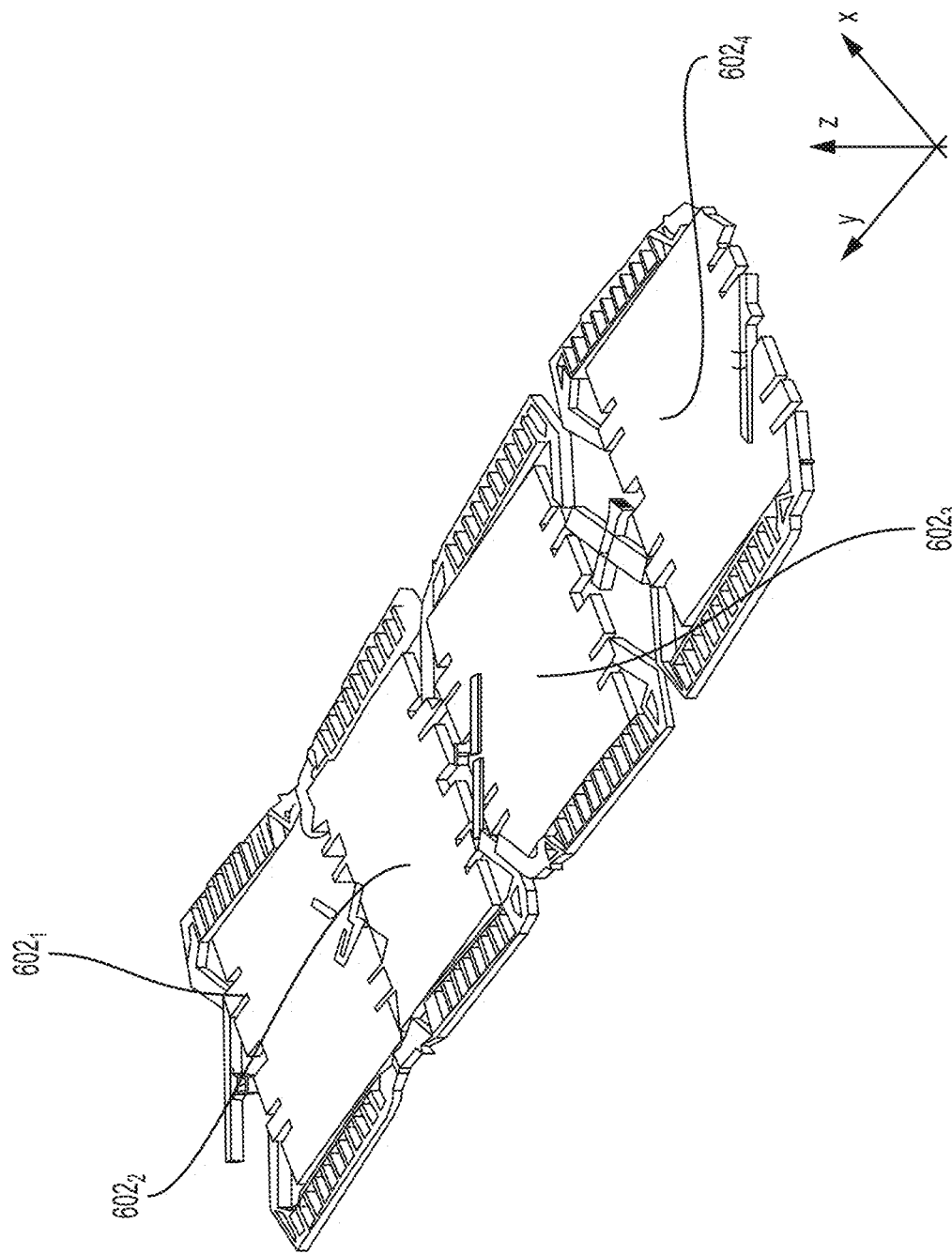
FIG. 6C is a perspective view illustrating schematically a another MEMS gyroscope when driven in the y-axis direction, according to some non-limiting embodiments.

FIG. 6C illustrates proof masses $602_1$, $602_2$, $602_3$ and $602_4$, which may be configured to sense pitch angular rates. Proof masses $602_1$, $602_2$, $602_3$ and $602_4$ may be configured to oscillate in the y-axis direction and to move, responsive to angular motion about the x-axis, out-of-plane. In the scenario illustrated in FIG. 6C, proof masses $602_1$ and $602_4$ move, along the y-axis direction, substantially in-phase with one another, and substantially anti-phase relative to proof masses $602_2$ and $602_3$.

FIG. 6C illustrates the drive mode of proof masses $602_1$, $602_2$, $602_3$ and $602_4$. As shown, the proof masses are driven in the y-axis direction such that proof masses $602_1$ is in-phase with proof mass $602_3$ and is anti-phase relative to proof masses $602_2$ and $602_4$.

Figure 6D:
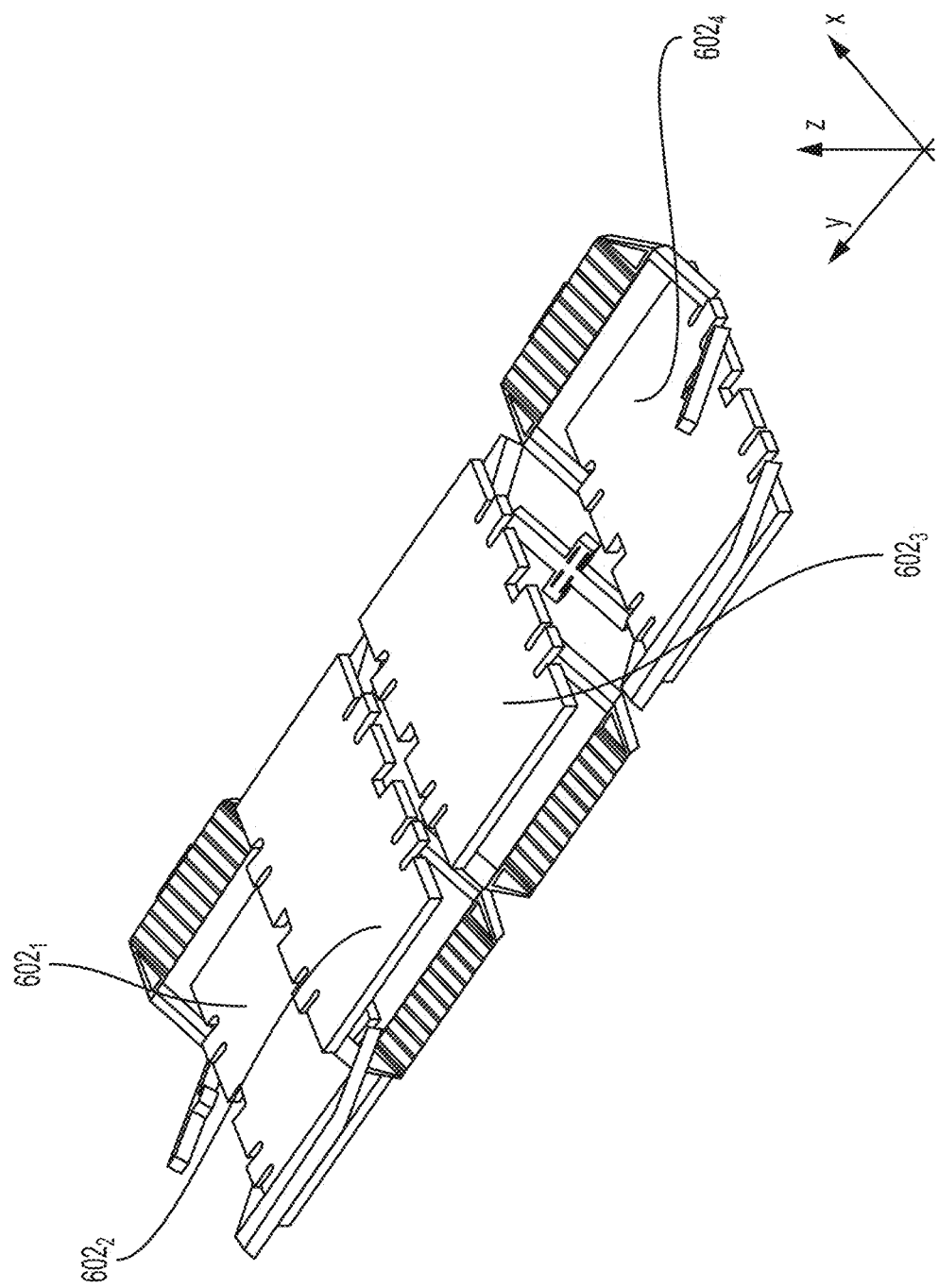
FIG. 6D is a perspective view illustrating schematically the MEMS gyroscope portion of FIG. 6C in the presence of a pitch angular motion, according to some non-limiting embodiments.

When the gyroscope is subjected to angular motion about the x-axis, proof masses $602_1$, $602_2$, $602_3$ and $602_4$ may move out-of-plane in response to a Coriolis force. This scenario is illustrated in FIG. 6D. As illustrated, proof masses $602_1$ and $602_4$ may move substantially in-phase with one another, and may move substantially anti-phase relative to proof masses $602_2$ and $602_3$. Pitch angular rates may be determined by sensing differential signals arising from the out-of-plane motion of these proof masses. To reject quadrature motion, proof masses $602_1$, $602_2$, $602_3$ and $602_4$ may include in-line springs and levers of the types described herein. Some embodiments may include the gyroscope of FIG. 6A and the gyroscope of FIG. 6C in the same substrate. These gyroscopes, for example, may be placed side-by-side. In some embodiments, a gyroscope for sensing yaw angular rates may be placed in the same substrate as the gyroscopes of FIGS. 6A and 6C.

It should be appreciated that aspects of the present application are not limited to use in connection with MEMS gyroscopes only. Accordingly, aspects of the present application may be applied to a wide variety of devices, including for example resonators or other vibrating MEMS structures, Lorentz-force detectors or other types of magnetometers. For example, aspects of the present application may be used in these devices to prevent (or at least limit) coupling from one mode of motion (e.g., a resonant mode, a translational mode and/or a rotational mode) to another mode of motion due to slanted sidewalls, which may degrade the performance of the device.

III. Applications

MEMS gyroscopes of the types described herein may be deployed in various settings to detect angular rates, including sports, healthcare, military, and industrial applications, among others. A MEMS gyroscope may be mounted as a wearable sensor deployed in monitoring sports-related physical activity and performance, patient health, military personnel activity, or other applications of interest of a user. A MEMS gyroscope may be disposed in a smartphone, and may be configured to sense roll, pitch and/or yaw angular rates.

Figure 7:
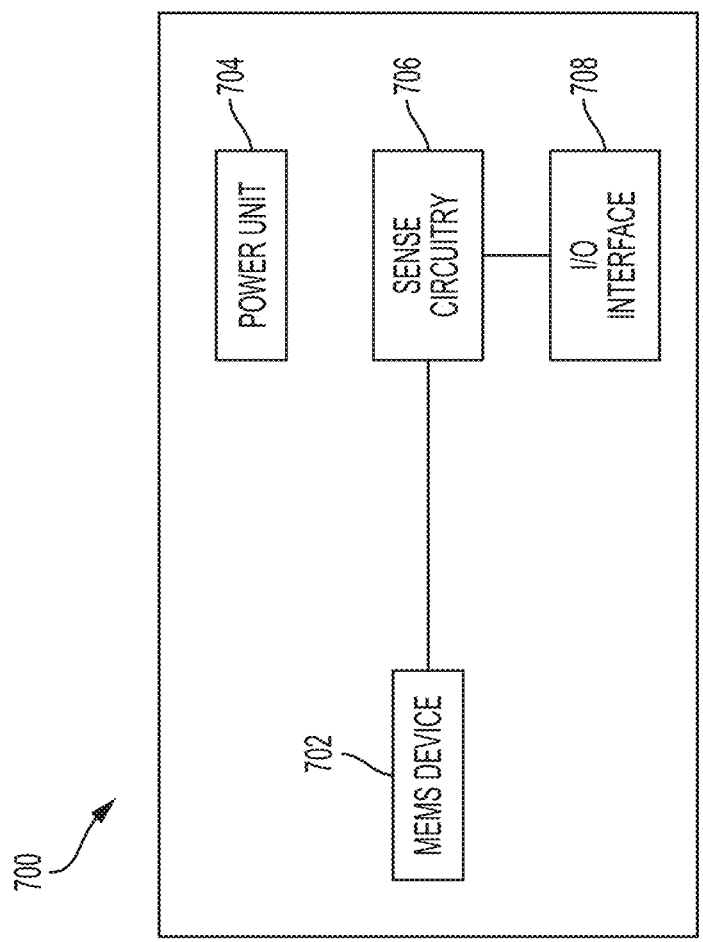
FIG. 7 is a block diagram illustrating a system including a MEMS gyroscope, according to some non-limiting embodiments.

FIG. 7 is a block diagram illustrating a system 700 comprising a MEMS device 702, a power unit 704, sense circuitry 706 and input/output (I/O) interface 708. MEMS device 702 may comprise any one or a combination of the MEMS gyroscopes described herein. The MEMS gyroscope(s) may be configured to sense roll, pitch and/or yaw angular rates.

System 700 may periodically transmit, via wired connections or wirelessly, data representing sensed angular rates to an external monitoring system, such as a computer, a smartphone, a tablet, a smartwatch, smartglasses, or any other suitable receiving device. I/O interface 708 may be configured to transmit and/or receive data via Wi-Fi, Bluetooth, Bluetooth Low Energy (BLE), Zigbee, Thread, ANT, ANT+, IEEE 802.15.4, IEEE 802.11.ah, or any other suitable wireless communication protocol. Alternatively, or additionally, I/O interface 708 may be configured to transmit and/or receive data using proprietary connectivity protocols. I/O interface 708 may comprise one or more antennas, such as a microstrip antenna. In some embodiments, I/O interface 708 may be connected to a cable, and may be configured to transmit and/or receive signals through the cable.

System 700 may be powered using power unit 704. Power unit 704 may be configured to power some or all of sense circuitry 706, I/O interface 708, MEMS device 702. In some embodiments, power unit 704 may comprise one or more batteries. System 700 may, in at least some embodiments, consume sufficiently little power to allow for its operation for extended periods based solely on battery power. The battery or batteries may be rechargeable in some embodiments. Power unit 704 may comprise one or more lithiumion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery. In some embodiments, power unit 704 may comprise circuitry to convert AC power to DC power. For example, power unit 704 may receive AC power from a power source external to system 700, such as via I/O interface 708, and may provide DC power to some or all the components of system 700. In such instances, power unit 704 may comprise a rectifier, a voltage regulator, a DC-DC converter, or any other suitable apparatus for power conversion.

Power unit 704 may comprise energy harvesting components and/or energy storage components, in some embodiments. Energy may be harvested from the surrounding environment and stored for powering the system 700 when needed, which may include periodic, random, or continuous powering. The type of energy harvesting components implemented may be selected based on the anticipated environment of the system 700, for example based on the expected magnitude and frequency of motion the system 700 is likely to experience, the amount of stress the system is likely to experience, the amount of light exposure the system is likely to experience, and/or the temperature(s) to which the system is likely to be exposed, among other possible considerations. Examples of suitable energy harvesting technologies include thermoelectric energy harvesting, magnetic vibrational harvesting, electrical overstress harvesting, photovoltaic harvesting, radio frequency harvesting, and kinetic energy harvesting. The energy storage components may comprise supercapacitors in some embodiments.

Figure 8:
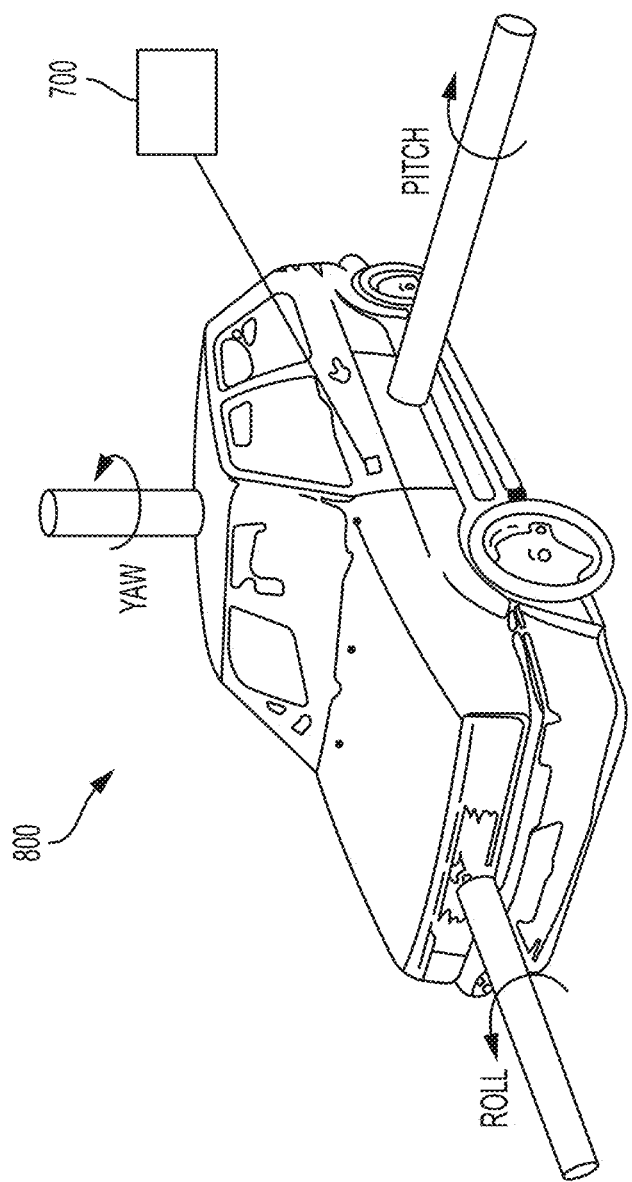
FIG. 8 is a perspective view illustrating an automobile including a system having a MEMS gyroscope, according to some non-limiting embodiments.

As described above, MEMS gyroscopes of the types described herein may be deployed in various settings to detect angular rates. One such setting is in automobiles, or other vehicles, such as boats or aircrafts. FIG. 8 illustrates schematically an automobile 800 comprising a system 700. System 700 may be disposed in any suitable location of automobile 800. System 700 may be configured to sense roll, pitch and/or yaw angular rates. System 700 may be configured to provide, using I/O interface 708, sensed angular rates to a computer system disposed in automobile 800 and/or to a computer system disposed on a base station outside automobile 800.

IV. Conclusion

Aspects of the technology described herein may provide one or more benefits, some of which have been previously described. Now described are some non-limiting examples of such benefits. It should be appreciated that not all aspects and embodiments necessarily provide all of the benefits now described. Further, it should be appreciated that aspects of the technology described herein may provide additional benefits to those now described.

Aspects of the technology described herein provide MEMS gyroscopes that exhibit increased immunity to quadrature motion. Such an immunity to quadrature motion may lead to, at least in some embodiments, decreased noise, offset and cross-axis sensitivity, and as a result, increased resolution of angular motion.

The expressions "substantially in a direction K" and "substantially parallel to a direction K" should be interpreted herein as parallel to direction K or angled with respect to direction K by less than 30°, including any value within that range.

What is claimed is:

1. An inertial sensor apparatus comprising:
a substrate;
a proof mass lying substantially in a plane;
a pivoting intermediate mass coupling the proof mass to the substrate;
at least one drive electrode configured to cause motion of the proof mass substantially in a first direction; and
at least one sense electrode disposed on the substrate and configured to sense out-of-plane motion of the proof mass in a second direction;
wherein the proof mass is coupled to the pivoting intermediate mass by a first spring that, in a rest position, is only oriented substantially parallel the first direction.

2. The inertial sensor apparatus of claim 1, wherein the pivoting intermediate mass is coupled to the substrate through an anchor, the pivoting intermediate mass being coupled to the anchor via a second spring oriented substantially parallel the first direction.

3. The inertial sensor apparatus of claim 1, wherein the pivoting intermediate mass is configured to pivot when the first spring complies in response to the motion of the proof mass.

4. The inertial sensor apparatus of claim 1, wherein the first spring is compliant in a direction substantially orthogonal to the first direction and to the second direction.

5. The inertial sensor apparatus of claim 1, wherein the proof mass is a first proof mass and the at least one drive electrode is a first drive electrode, and further comprising a second proof mass and a second drive electrode, wherein the first and second drive electrodes are configured to drive the first and second proof masses, respectively, substantially anti-phase relative to one another.

6. The inertial sensor apparatus of claim 5, wherein the first proof mass is connected to the second proof mass via a paddle compliant in a direction substantially orthogonal to the first direction and to the second direction.

7. The inertial sensor apparatus of claim 6, wherein the paddle is configured to enable out-of-plane, anti-phase motion of the first and second proof masses in response to angular motion.

8. The inertial sensor apparatus of claim 1, wherein the first spring comprises a first beam oriented substantially parallel to the first direction and a second beam oriented substantially orthogonal to the first direction and the second direction, wherein the first beam is longer and/or narrower than the second beam.

9. The inertial sensor apparatus of claim 1, wherein the inertial sensor apparatus lacks springs oriented substantially orthogonal to the first direction and coupling the proof mass to the pivoting intermediate mass.

10. The inertial sensor apparatus of claim 1, wherein the first spring comprises at least one slanted sidewall.

11. The inertial sensor apparatus of claim 1, wherein the inertial sensor apparatus is a gyroscope.

12. A method for detecting angular motion using an inertial sensor apparatus, the method comprising:
causing a proof mass lying substantially in a plane to oscillate in a first direction, wherein causing the proof mass to oscillate in the first direction comprises causing an intermediate mass to pivot, the intermediate mass coupling the proof mass to a substrate, and the proof mass being coupled to the intermediate mass by a first spring that, in a rest position, is only oriented substantially parallel the first direction; and sensing out-of-plane motion of the proof mass in a second direction substantially perpendicular to the first direction.

13. The method of claim 12, wherein the proof mass is a first proof mass and wherein the method further comprises:
    causing a second proof mass to oscillate in the first direction substantially anti-phase relative to the first proof mass; and
    sensing motion of the second proof mass in the second direction.

14. The method of claim 12, wherein the inertial sensor apparatus lacks springs oriented substantially orthogonal to the first direction and coupling the proof mass to the intermediate mass.

15. The method of claim 12, wherein causing the proof mass to oscillate in the first direction comprises causing the first spring to comply in a direction substantially orthogonal to the first direction and to the second direction.

16. An inertial sensor apparatus comprising:
    a substrate;
    a proof mass lying substantially in a plane;
    a pivoting intermediate mass coupling the proof mass to the substrate;
    at least one drive electrode configured to cause in-plane motion of the proof mass in a first direction; and
    at least one sense electrode disposed on the substrate and configured to sense out-of-plane motion of the proof mass in a second direction;
    wherein the proof mass is coupled to the pivoting intermediate mass by a first spring that is compressive only along one axis, wherein the axis is substantially orthogonal to the first direction and to the second direction when the first spring is in a rest position.

17. The inertial sensor apparatus of claim 16, wherein the inertial sensor apparatus lacks springs oriented substantially orthogonal to the first direction and coupling to proof mass to the pivoting intermediate mass.

18. The inertial sensor apparatus of claim 17, wherein the first spring comprises a first beam oriented substantially parallel to the first direction and a second beam oriented substantially orthogonal to the first direction and the second direction, wherein the first beam is longer and/or narrower than the second beam.

19. The inertial sensor apparatus of claim 17, wherein the proof mass is a first proof mass and the at least one drive electrode is a first drive electrode, and further comprising a second proof mass and a second drive electrode, wherein the first and second drive electrodes are configured to drive the first and second proof mass, respectively, substantially anti-phase relative to one another.

20. The inertial sensor apparatus of claim 19, wherein the first proof mass is connected to the second proof mass via a paddle configured to enable out-of-plane, anti-phase motion of the first and second proof masses in response to angular motion.

* * * * *